United States Patent
Ohara

(10) Patent No.: US 9,673,419 B2
(45) Date of Patent: Jun. 6, 2017

(54) DISPLAY DEVICE AND MANUFACTURING METHOD THEREOF

(71) Applicant: Japan Display Inc., Tokyo (JP)

(72) Inventor: Hiroki Ohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 28 days.

(21) Appl. No.: 14/818,390

(22) Filed: Aug. 5, 2015

(65) Prior Publication Data
US 2016/0043340 A1 Feb. 11, 2016

(30) Foreign Application Priority Data
Aug. 8, 2014 (JP) .................. 2014-162742

(51) Int. Cl.
*H01L 51/52* (2006.01)
(52) U.S. Cl.
CPC ................ *H01L 51/5253* (2013.01)
(58) Field of Classification Search
None
See application file for complete search history.

(56) References Cited

U.S. PATENT DOCUMENTS

| | | | | |
|---|---|---|---|---|
| 8,034,419 B2 * | 10/2011 | Erlat | ............. | C23C 16/30 204/192.1 |
| 8,598,786 B1 * | 12/2013 | Kim | ............. | H01L 51/5253 257/40 |
| 8,772,824 B2 * | 7/2014 | Lee | ............. | H01L 27/00 257/100 |
| 9,343,699 B2 * | 5/2016 | Kwak | ............. | H01L 51/5253 |
| 2002/0125822 A1 | 9/2002 | Graff et al. | | |
| 2004/0046497 A1 * | 3/2004 | Schaepkens | ............. | B82Y 20/00 313/506 |
| 2005/0285521 A1 * | 12/2005 | Menda | ............. | H01L 51/5253 313/512 |
| 2009/0108747 A1 | 4/2009 | Ishida et al. | | |
| 2010/0200846 A1 * | 8/2010 | Kwack | ............. | H01L 51/5253 257/40 |
| 2011/0163330 A1 * | 7/2011 | Kim | ............. | H01L 51/5256 257/88 |

(Continued)

FOREIGN PATENT DOCUMENTS

| | | |
|---|---|---|
| JP | 2011-213847 A | 10/2011 |
| JP | 2012-116151 A | 7/2012 |

(Continued)

OTHER PUBLICATIONS

Korean Office Action dated May 21, 2016 for corresponding Korean Patent Application No. 10-2015-0108815.

(Continued)

*Primary Examiner* — Lex Malsawma
(74) *Attorney, Agent, or Firm* — Typha IP LLC

(57) ABSTRACT

Provide is a display device that prevents adverse effects on pixel circuits, resulting from a process related to a sealing film, and a manufacturing method of the display device. A display device includes pixel circuits on a substrate and a sealing film having a multilayer structure on the pixel circuits. The sealing film includes a first layer being formed in contact with the pixel circuits and being made of a silicon-containing inorganic material. The first layer is a mixed film containing at least one component changing seamlessly in a stacking direction.

7 Claims, 18 Drawing Sheets

(56) References Cited

U.S. PATENT DOCUMENTS

| | | | | |
|---|---|---|---|---|
| 2015/0069349 A1* | 3/2015 | Hayashi | ............... | H01L 51/524 257/40 |
| 2015/0349290 A1* | 12/2015 | Iwase | ............... | H01L 51/5253 428/213 |
| 2015/0368802 A1* | 12/2015 | Yamada | ............... | C23C 16/345 427/579 |

FOREIGN PATENT DOCUMENTS

| | | |
|---|---|---|
| JP | 5341701 B2 | 11/2013 |
| KR | 10-2008-0073320 A | 8/2008 |
| TW | 201126785 A | 8/2011 |

OTHER PUBLICATIONS

Taiwanese Office Action of May 23, 2016 for corresponding Taiwan Patent Application No. 104122615.

* cited by examiner

DISPLAY DEVICE AND MANUFACTURING METHOD THEREOF

CROSS-REFERENCE TO RELATED APPLICATION

The present application claims priority from Japanese application JP 2014-162742, filed on Aug. 8, 2014, the content of which is hereby incorporated by reference into this application.

BACKGROUND OF THE INVENTION

1. Field of the Invention

The present invention relates to a display device including a sealing film formed on a substrate and a manufacturing method of the display device.

2. Description of the Related Art

For example, a sealing film is used in a display device including organic electroluminescence elements (hereinafter, simply "organic EL elements"). Such a display device with organic EL elements includes a thin film transistor (TFT) substrate and a counter substrate. The TFT substrate has a plurality of pixel circuits formed on its display area. Each pixel circuit includes an organic EL layer on the TFT substrate as part of the circuit. Typically, semiconductor devices, such as organic EL elements, can be easily and adversely affected, for example, by moisture and oxygen in the air. Thus, a sealing film is formed to protect pixel circuits. The TFT substrate and the counter substrate are bonded together to seal the pixel circuits formed in the display area.

The display device, into which display image information and power supply are input from external devices, has a terminal for connection to the external devices. The terminal is usually formed on the TFT substrate. That is, the TFT substrate has the terminal as well as the areas (the display area and a frame area) which are bonded to the counter substrate. Thus, the TFT substrate spreads more broadly than the counter substrate, which is bonded to the TFT substrate. In the manufacturing process, a portion, on the area to be the terminal, of the sealing film formed on the TFT substrate is removed.

SUMMARY OF THE INVENTION

It is preferable to improve the characteristics of the sealing film, for example, to protect the pixel circuits from moisture in the outside air better. As a sealing film technology, JP 2011-213847 A, for example, discloses a silicon-containing sealing film including a modified region formed by applying plasma exposure to a polysilazane film. In addition, US 2002/125822 A discloses a multilayer sealing film.

However, in a process for forming the sealing film and in a process for removing the sealing film on the area to be the terminal, long processing time (takt time) in a high-temperature environment may adversely affect the reliability of the pixel circuits, such as the organic EL layer, formed in the display area. Thus, to prevent such adverse effects on the pixel circuits, it is preferable to form the sealing film and remove the sealing film on the terminal in a lower-temperature environment and in less time, while maintaining the function as the sealing film to protect the pixel circuits formed on the TFT substrate.

However, if a modified region is formed in a silicon-containing sealing film by plasma exposure like the technology disclosed in JP 2011-213847 A, the organic EL layer underlying the sealing film, for example, may be adversely affected in the manufacturing process.

Like the technology disclosed in US 2002/125822 A, a multilayer sealing film including a plurality of layers can improve the characteristics of the sealing film. However, in the process for forming the multilayer sealing film, after stacking a layer under a certain condition and before stacking the next layer, another condition needs to be created. It requires another process to stabilize the other condition, thus taking more processing time. Moreover, in the process for removing the sealing film on the area to be the terminal on the TFT substrate, after removing a layer under a certain condition and before removing the next layer underlying the layer, another condition needs to be created. It takes another process and more processing time.

In view of such problems, it is an object of the present invention to provide a display device that prevents adverse effects on pixel circuits, resulting from a process related to a sealing film, and a manufacturing method of the display device.

(1) A display device according to an aspect of the present invention includes pixel circuits on a substrate and a sealing film having a multilayer structure on the pixel circuits. The sealing film includes a first layer. The first layer may be formed in contact with the pixel circuits and be made of a silicon-containing inorganic material. The first layer may be a mixed film containing at least one component changing seamlessly in a stacking direction.

(2) In the display device according to the above (1), the sealing film may further include a second layer. The second layer may be formed on at least part of the top of the first layer and be made of a resin material.

(3) In the display device according to the above (2), the composition of the top of the first layer may have higher adhesion to the bottom of the second layer than the composition of the bottom of the first layer.

(4) In the display device according to any of the above (1) to (3), the composition of the bottom of the first layer may be one component selected from the group consisting of silicon nitride, silicon oxynitride, and silicon oxide.

(5) In the display device according to any of the above (1) to (3), the composition of the bottom of the first layer may be silicon nitride, and the composition of the top of the first layer may be one component selected from the group consisting of silicon oxide and amorphous silicon.

(6) In the display device according to the above (2) or (3), the resin material of the second layer may be an organic resin.

(7) In the display device according to any of the above (1) to (6), the pixel circuits may include an organic electroluminescence layer.

(8) A manufacturing method of a display device according to an aspect of the present invention includes the following steps. Pixel circuits may be formed on a substrate. A sealing film having a multilayer structure may be formed on the pixel circuits. The sealing film may include a first layer. The first layer may be formed in contact with the pixel circuits and be made of a silicon-containing inorganic material. The first layer may be sequentially formed by changing at least one component of the first layer seamlessly in a stacking direction.

(9) In the manufacturing method of the display device according to the above (8), in a process for forming the first layer by chemical vapor deposition, the types and the flow rates of process gases flowing in may be changed seamlessly.

(10) In the manufacturing method of the display device according to the above (9), the sealing film may further include a second layer made of a resin material, and the second layer may be formed on at least part of the top of the first layer.

DETAILED DESCRIPTION OF THE INVENTION

Embodiments of the present invention are described below with reference to the accompanying drawings. The disclosure herein is merely an example, and appropriate modifications coming within the spirit of the present invention, which are easily conceived by those skilled in the art, are intended to be included within the scope of the invention as a matter of course. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus are not described in detail herein as appropriate.

Figure 1:
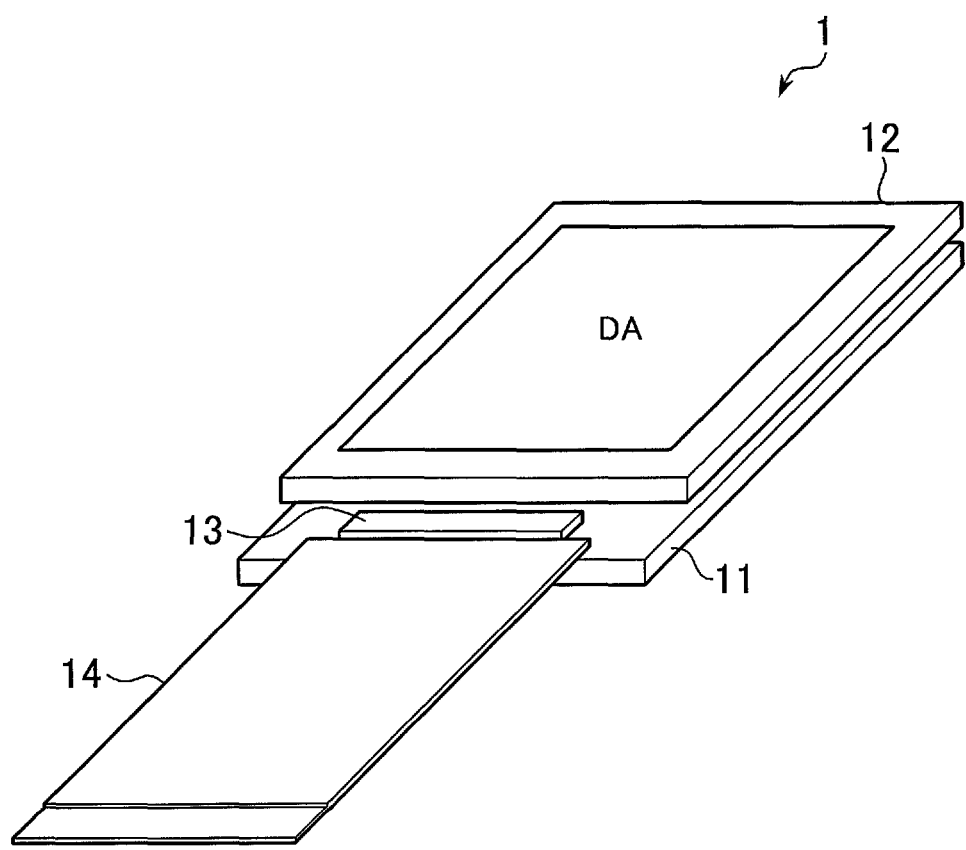
FIG. 1 is a perspective view of a display device according to an embodiment of the present invention.

FIG. 1 is a perspective view of a display device according to an embodiment of the present invention. The display device according to this embodiment is an organic EL display device 1. As shown in FIG. 1, the organic EL display device includes a TFT substrate 11 including pixel circuits, a CF substrate 12 including a color filter (CF), an IC driver 13, and a flexible printed circuit substrate (FPC) 14. The CF substrate 12 is bonded to an area including a display area DA in the top of the TFT substrate 11 to keep out the outside air. The TFT substrate 11 and the CF substrate 12 constitute an organic EL panel. Outside the area, to which the CF substrate 12 is bonded, in the top of the TFT substrate 11, a terminal is formed, and a plurality of terminal electrodes and wirings are exposed. The IC driver 13 is disposed on the terminal, and the FPC 14, which includes electrical wirings coupled to the corresponding terminal electrodes of the terminal, is connected to the terminal via an anisotropic conductive film (ACF) by thermo-compression bonding.

Figure 2:
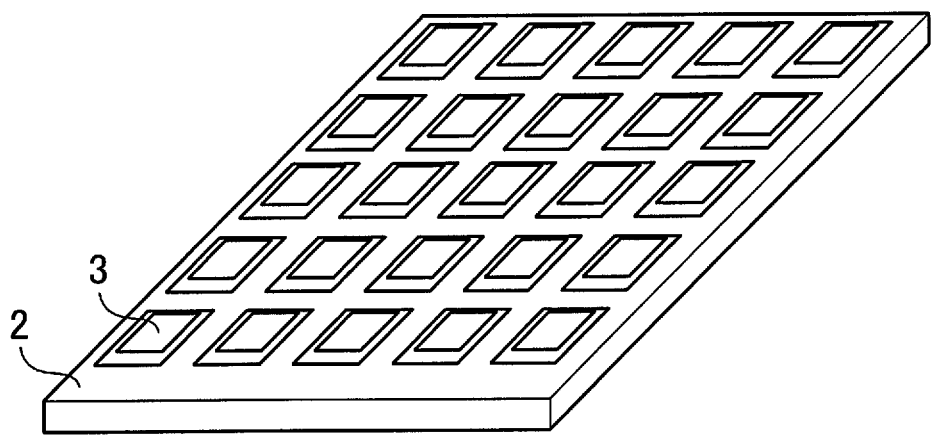
FIG. 2 is a diagram showing the display device, which is in process of manufacture, according to the embodiment of the present invention.

FIG. 2 is a diagram showing the display device, which is in process of manufacture, according to this embodiment. A sealing film is formed on the entire surface of a substrate (array substrate) including a plurality of TFT substrates 11 arranged in a matrix. A substrate in which a plurality of CF substrates 12 corresponding to the TFT substrates 11 are arranged in a matrix is bonded to the array substrate (and may be ground as needed) and are then divided (cut) into individual pieces to form a plurality of cells 3. The cells 3 are arranged in a matrix on a tray 2, and a portion to be the terminal on each TFT substrate 11 is exposed by removing the corresponding portion of the sealing film. FIG. 2 shows the cells 3 arranged in a matrix on the tray 2.

Figure 3:
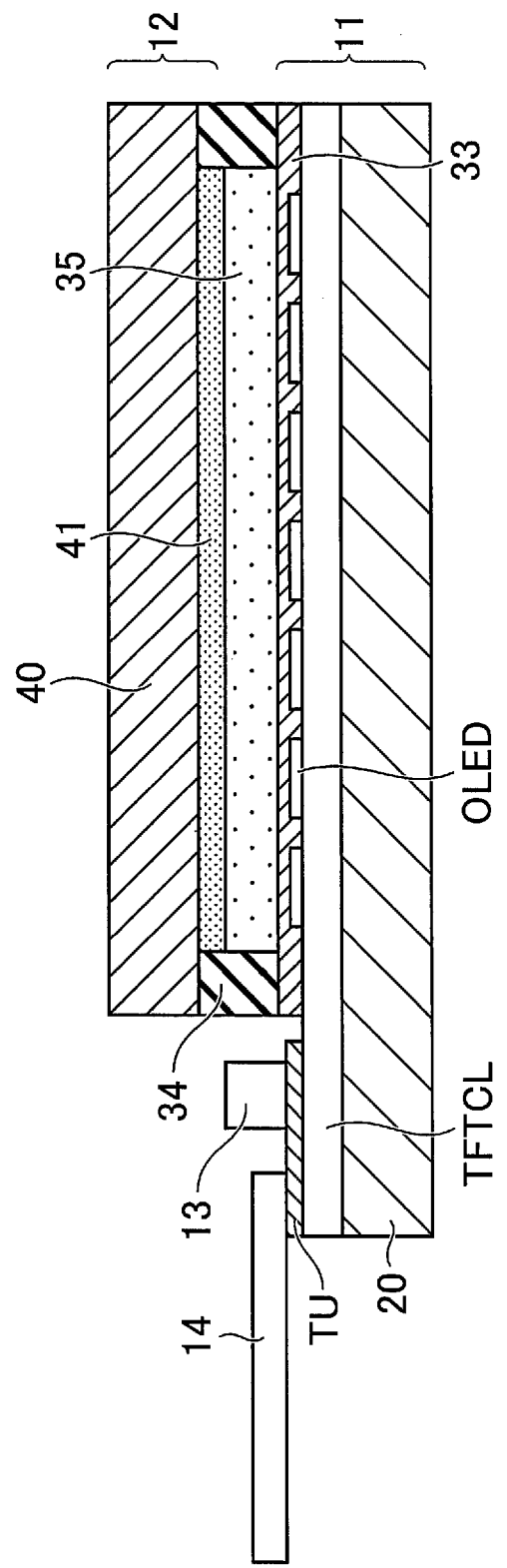
FIG. 3 is a cross-sectional view of the display device according to the embodiment of the present invention.

FIG. 3 is a cross-sectional view of the display device according to this embodiment. FIG. 3 schematically shows a cross section, taken along the longitudinal direction, of the display device shown in FIG. 1. That is, FIG. 3 shows a cross section taken along the direction in which the FPC 14 extends from the terminal. As shown in FIG. 3, a TFT circuit layer TFTCL is formed on a glass substrate 20, and organic EL elements OLED are formed on the TFT circuit layer TFTCL. A sealing film 33 is formed on the top of the TFT substrate 11. As described above, the sealing film on the area in which a terminal TU is formed has been removed so that the terminal electrodes of the terminal TU and the wirings are exposed. The IC driver 13 is disposed on the terminal TU, and the FPC 14 is connected to the terminal TU.

The CF substrate 12 includes a color filter 41 formed on the surface, the bottom shown in FIG. 3, of a transparent substrate 40 made of a glass material. In the color filter 41, color filters corresponding one-to-one to the pixel circuits formed in the TFT substrate 11 are regularly arranged to face the pixel circuits. The TFT substrate 11 and the CF substrate 12 are bonded together to face each other via a sealant 34 (dam agent) formed along the frame area surrounding the display area DA to keep out the outside air. A space sealed between the TFT substrate 11 and the CF substrate 12 is filled with a filler 35. The filler 35 may be a resin or an inert gas.

Figure 4:
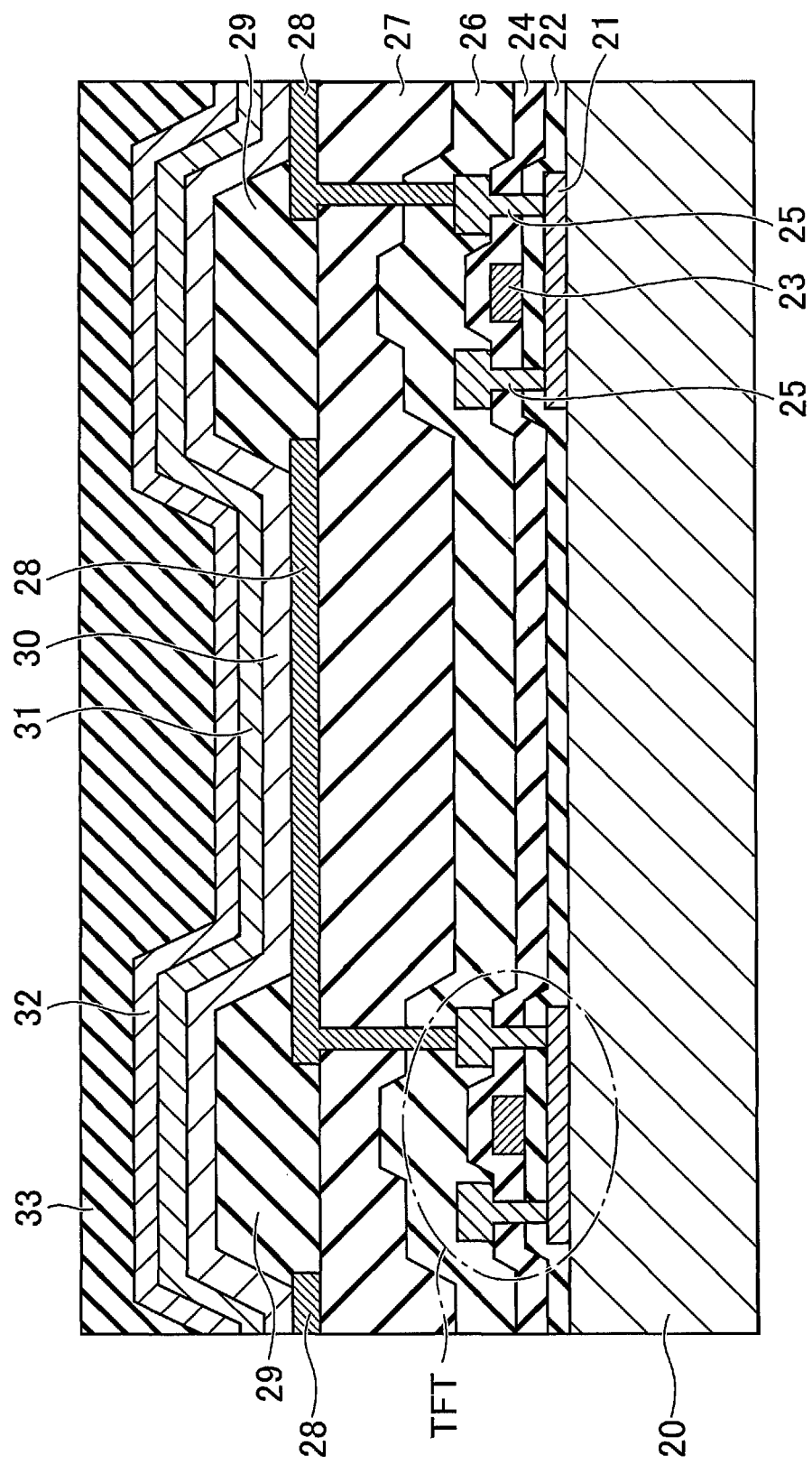
FIG. 4 is a cross-sectional view of a TFT substrate of the display device according to the embodiment of the present invention.

FIG. 4 is a cross-sectional view of the TFT substrate 11 of the display device according to this embodiment. FIG. 4 shows a cross section of the portion (display area DA), including a pixel circuit, in the TFT substrate 11. The pixel circuit includes a TFT formed on the glass substrate 20. The TFT shown in FIG. 4 is a top-gate TFT, and the semiconductor film of the TFT is a low-temperature polysilicon (LIPS). As shown in FIG. 4, a semiconductor film 21 (LIPS) is formed in a predetermined shape on the glass substrate 20. Then, a gate insulating film 22 is formed on the entire surface of the substrate, a gate electrode film 23 is formed in a predetermined shape on the gate insulating film 22 to face the channel region of the semiconductor film 21. Then, an insulating film 24 is formed on the entire surface of the substrate. Both sides of the channel region of the semiconductor film 21 are doped with a (p-type or n-type) dopant. The insulating film 24 and the gate insulating film 22 are partly removed and through holes are formed to reach the corresponding doped regions of the semiconductor film 21. Metal layers 25 are formed near both sides of the gate electrode film 23 to fill the through holes and to lie on the insulating film 24 around the through holes. Then, a passivation film 26 is formed on the entire surface of the substrate, and a planarization film 27 is formed on the passivation film 26. One of the metal layers 25 becomes a source electrode and the other becomes a drain electrode. The semiconductor film 21, the gate electrode film 23, and the metal layers 25 constitute the TFT. The TFT is formed in each of the pixel circuits in the display area DA. The TFT circuit layer TFTCL shown in FIG. 3 corresponds to the semiconductor film 21, the gate insulating film 22, the gate electrode film 23, the insulating film 24, the metal layer 25, the passivation film 26, and the planarization film 27 shown in FIG. 4.

The planarization film 27 and the passivation film 26 are partly removed and a through hole is formed to reach one of the metal layers 25, the source electrode and the drain electrode, of the TFT. Each of the pixel circuits has an anode 28 formed in a predetermined shape to fill the through hole. A bank 29 is formed to insulate adjacent anodes 28 from each other. Then, an organic EL layer 30 entirely covering the anodes 28 and the bank 29, a first cathode 31 covering the organic EL layer 30, a second cathode 32 covering the first cathode 31, and the sealing film 33 covering the second cathode 32 are sequentially stacked. The first cathode 31 is, for example, an indium zinc oxide (IZO: registered trademark) film or an ITO film. The second cathode 32 is a conductive organic film. This conductive organic film may be made of polymer acetylene, polythiophenes, or a polymer composite. Alternatively, the conductive organic film may be made of poly(3,4-ethylenedioxythiophene):poly(styrenesulfonate) (PEDOT:PSS) or the same material as a charge generation layer (CGL). One anode 28 included in each pixel circuit, the organic EL layer 30 commonly included in the pixel circuits, the first cathode 31, and the second cathode 32 constitute one organic EL element OLED shown in FIG. 3. That is, each pixel circuit includes one organic EL element OLED. The transparency and the material of the anode (the anode 28) and the cathode (the first cathode 31 and the second cathode 32) may be selected based on how the organic EL element OLED emits light. The organic EL element OLED according to this embodiment is a top-emitting organic EL element in which its anode is a respective electrode and its cathode is a highly light-transparent electrode. Specifically, the anode 28 has a three-layer structure including an ITO film, a Ag film, and an ITO film. The cathode has a two-layer structure including the first cathode 31 formed of an IZO film and the second cathode formed of a conductive organic film. Forming the second cathode 32 on the first cathode 31 enables the cathode to be of desirably low resistance. However, the structure of the cathode is not limited to this structure. For example, the cathode may have a single-layer structure such as an ITO film or an IZO film. Alternatively, the cathode may have a three-layer structure including a metal layer made of a low work function metal, such as Ag, Al, AlMg, AlLi, or MgAg, a transparent metal oxide film layer, such as an ITO film or an IZO film, on this metal layer, and a conductive organic film layer on the this transparent metal oxide film layer.

Figure 5:
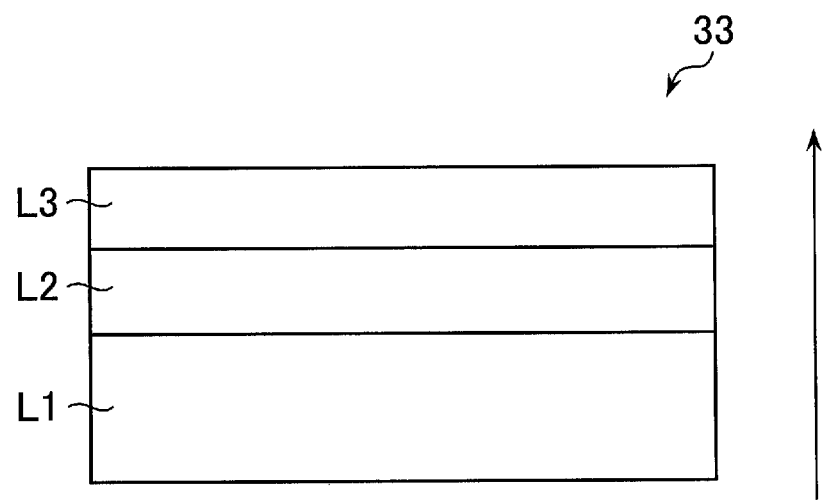
FIG. 5 is a schematic diagram showing the structure of a sealing film of the display device according to the embodiment of the present invention.

FIG. 5 is a schematic diagram showing the structure of the sealing film 33 of the display device according to this embodiment. The sealing film 33 according to this embodiment has a three-layer stack structure (multilayer structure) including a first layer L1, a second layer L2, and a third layer L3, which are sequentially stacked from the substrate (the glass substrate 20) in the stacking direction indicated by the arrow in FIG. 5. That is, the first layer L1, which is the bottom layer in the multilayered sealing film 33, is formed in contact with the pixel circuits. The first layer L1 is formed in contact with the cathode (the second cathode 32), which is the top layer in the pixel circuits. A main feature of the present invention is that the first layer L1 of the sealing film 33 is a mixed film. The mixed film is a single-layer film without any interface or with indefinite interface(s), which is generated by continuously forming a plurality of layers without suspending the film formation process. In the mixed film, at least some of its components change seamlessly in the stacking direction. For example, in forming the mixed film by chemical vapor deposition (hereinafter "CVD"), a single layer whose composition changes seamlessly from one composition to another composition (i.e., without any interface) is formed by gradually decreasing and then stopping process gases for the one composition and by gradually adding other process gases for the other composition without suspending the film formation process. The mixed film does not include a film including two or more layers formed one by one by suspending the film formation process.

In this embodiment, the sealing film 33 has the three-layer structure including the first layer L1 made of a Si-containing inorganic material, the second layer L2 made of a resin material, and the third layer L3 made of an inorganic material. The second layer L2 is an organic resin film, such as an acrylic resin film or a polyimide resin film. The third layer L3 is an inorganic film (Si-containing inorganic film), such as a SiN film. In a first example according to this embodiment, the first layer L1 is a mixed film whose composition changes seamlessly from silicon nitride (SiN) to silicon oxide (SiO) when viewed from the substrate. In a second example according to this embodiment, the first layer L1 is a mixed film whose composition changes seamlessly from SiN to amorphous silicon (a-Si) when viewed from the substrate. The film thickness of the first layer L1 and the third layer L3 is preferably within a range of 200 to 1000 nm, and more preferably within a range of 350 to 450 nm. The film thickness of the second layer L2 is preferably within a range of 200 to 1000 nm. As described below, the second layer L2 is formed on at least part of the top of the first layer L1, and the top of the first layer L1 can have an area on which the second layer L2 is not formed. The film thickness of the second layer L2 here means the maximum value of the film thickness of the second layer L2 in the area where the second layer L2 is formed.

To discuss the effect of the present invention, the case where two layers, a SiN layer and a SiO layer, are formed instead of the first layer L1 in the first example will be considered. In this case, the sealing film has a four-layer structure including a SiN layer (first SiN layer), a SiO layer, an acrylic resin layer, and a SiN layer (second SiN layer), which are sequentially stacked. Such a sealing film is a first comparative example.

The first layer L1 of the sealing film 33 according to this embodiment is formed on the cathode (the second cathode 32). The composition of the bottom of the first layer L1 is preferably SiN (which can be written as $SiN_x$), to protect the cathode (the second cathode 32 and the first cathode 31) and the organic EL layer 30, which underlie the sealing film 33, from moisture. However, the composition of the bottom of the first layer L1 is not limited to this composition and may be silicon oxynitride (SiON, which can be written as $SiO_xN_y$) or SiO (which can be written as $SiO_x$). The top of the first layer L1 is preferably SiO or a-Si to ensure adhesion to the second layer L2 stacked on the upper side of the first layer L1. However, the composition of the top of the first layer L1 has only to have higher adhesion to the bottom of the second layer L2 than the composition of the bottom of the first layer L1. Similarly, the correspondingly of the third layer L3 is preferably SiN, but may be SiON or SiO. The composition of the second layer L2 is a resin material, preferably an organic resin, such as an acrylic resin, a polyimide resin, or an epoxy resin, but may be an inorganic resin, such as a silicone resin, for example, siloxane. The composition of the top of the first layer L1 has only to be selected in terms of how to ensure adhesion to the second layer L2.

The formation of the sealing film according to the first comparative example by CVD requires a switching process in between forming the first SiN layer and forming the SiO layer. Specifically, steps other than actually forming films, for example, time to draw a vacuum in a chamber, time to switch to other process gases and stabilize their flow rates, and time to stabilize a plasma state are required. On the other hand, the formation the sealing film 33 according to this embodiment by CVD does not require such steps and can shorten the processing time, thus reducing adverse effects, for example, on the organic EL materials constituting the organic EL layer 30. The reason is that the organic EL materials tend to deteriorate or crystallize out when the environmental temperature exceeds 100° C. In forming the SiO layer of the sealing film according to the first comparative example, the SiO layer is expected to be equal to or less than 10 nm. High controllability is required to stably form such a thin film, and thus causes a decrease in the yield. On the other hand, the sealing film 33 according to this embodiment is expected to include SiO or a-Si only in the interface region between the first layer L1 and the second layer L2, that is, in the top and a very thin region immediately under the top of the first layer L1. In terms of adhesion to the upper layer (the second layer L2), the same degree of sealing effect as the first comparative example is achieved. Nevertheless, the sealing film 33 does not require any high controllability, and thus can produce a further effect of improving the yield.

Also in a process for removing the sealing film on the area to be the terminal, for example, when removing the sealing film on such an area by dry etching, the first layer L1 of the sealing film 33 in this embodiment can be removed only by changing the etching rate without changing any other etching conditions. In contrast, the case of removing, by dry etching, the SiO layer and the SiN layer of the sealing film according to the first comparative example will be considered. The selection ratio of SiN to SiO is large, so that it takes longer to remove SiO under the same etching conditions as SiN. Moreover, a switching step is required to change the etching conditions in between removing the SiO layer and removing the SiN, and thus further prolongs the processing time. Thus, the sealing film 33 according to this embodiment can be removed in less processing time than the sealing film according to the first comparative example is removed. Also in this process, adverse effects, for example, on the organic EL materials can be reduced. For example, the use of dry etching reduces the processing time, and thus can reduce the amount of etching gas used. A fluorine-containing gas (especially, $SF_6$ gas) has a large adverse impact on the environment. Thus, a further effect of reducing such an adverse impact on the environment is produced when using a fluorine-containing gas as an etching gas.

The processing time in the process for forming the sealing film and in the process for removing the sealing film on the terminal can be shorten, so that the organic panel can remain in a low-temperature environment in the manufacturing process. Consequently, heat-caused adverse effects on the organic panel can be reduced, and high-reliability display devices can be manufactured.

The following describes a manufacturing method of the TFT substrate 11 according to this embodiment. In a known LTPS process, the TFT circuit layer TFTCL, the plurality of layers ranging from the semiconductor film 21 to the planarization film 27 (refer to FIG. 4), is formed on the glass substrate 20.

The following describes the formation of the organic EL element OLED. A plurality of anodes 28 are each formed in the predetermined shape on the planarization film 27, and then the bank 29, made of a bank material, such as an acrylic resin, a polyimide resin, or tetraethyl orthosilicate (Si$(OC_2H_5)_4$: TEOS), is formed to cover the edge of the anodes 28. The areas on the anodes 28 and on which the bank 29 is not formed are openings, which define the light-emitting area. The bank material is formed into a film on the entire substrate by a coating method, such as spin coating or ink-jet printing, and the film is then patterned with a photomask to form the bank 29.

The organic EL layer 30, made of low-molecular-weight materials, is formed to cover the anodes 28 and the bank 29 throughout their entire surfaces by vapor deposition. The organic EL layer 30 is a separated-function element having a stack structure in which each layer in a multilayer film separately has one of the functions, such as electron injection, electron transport, and hole transport. To polymeric materials, other methods than vapor deposition, such as printing, ink-jet printing, and laser transfer, can be applied. In addition, the first cathode 31, the second cathode 32, and the sealing film 33 are sequentially formed to cover the organic EL layer 30 throughout its entire surface.

The following describes the formation of the sealing film 33. The first layer L1 and the third layer L3 are formed by CVD. Table 1 shows examples of the types of process gases used in the CVD and their flow rates. The unit of flow rate is standard liters per minute (slm). The following table shows the types of gases, used as the process gases, and their flow rates, in forming a SiN layer, a SiO layer, and an a-Si layer. It is preferable to use a mass flow controller (MFC) that corresponds to each gas flow, because the conditions for forming the sealing film can be changed between the design and the actual formation.

| flow rate [slm] | SiH$_4$ | NH$_3$ | N$_2$O | H$_2$ | N$_2$ | Ar |
|---|---|---|---|---|---|---|
| SiN | 1.3 | 2.0 | 0 | 4 | 20 | 0 |
| SiO | 0.09 | 0 | 1.3 | 0 | 0 | 0 |
| a-Si | 0.33 | 0 | 0 | 0 | 0 | 16.5 |

The first layer L1 according to this embodiment is the mixed film whose composition changes seamlessly from SiN to SiO (the first example) or a-Si (the second example) when viewed from the substrate. Thus, in forming the first layer L1 according to the first example, SiN is formed into a film having a predetermined thickness from the substrate, while keeping the flow rates of SiH$_4$ gas, NH$_3$ gas, H$_2$ gas, and N$_2$ gas constant so that the gases flow at the predetermined flow rates shown in the above table. Then, the flow rates of SiH$_4$ gas, NH$_3$ gas, H$_2$ gas, and N$_2$ gas are decreased seamlessly without suspending the film formation process. The flow rate of SiH$_4$ gas is changed to 0.09 and the flow rates of NH$_3$ gas, H$_2$ gas, and N$_2$ gas are changed to zero. In addition, the flow rate of N$_2$O gas is increased from zero to 1.3. Thus, the concentration of nitrogen (N) and the concentration of hydrogen (H) decrease seamlessly and monotonously in the stacking direction, and the concentration of oxygen (O) increases seamlessly and monotonously in the stacking direction. Consequently, the bottom (and at least a very thin region immediately over the bottom) of the first layer L1 is formed of SiN, and the top (and at least a very thin region immediately under the top) of the first layer L1 is formed of SiO. Similarly, in forming the first layer L1 according to the second example, SiN is formed into a film having a predetermined thickness from the substrate, and then the flow rates of SiH$_4$ gas, NH$_3$ gas, H$_2$ gas, N$_2$ gas are decreased seamlessly without suspending the film formation process. The flow rate of SiH$_4$ gas is changed to 0.33 and the flow rates of NH$_3$ gas, H$_2$ gas, and N$_2$ gas are changed to zero. In addition, the flow rate of Ar gas is increased from zero to 16.5. Thus, the concentration of N and the concentration of H decrease seamlessly and monotonously in the stacking direction. Consequently, the bottom of the first layer L1 is formed of SiN, and the top of the first layer L1 is formed of a-Si.

The second layer L2 is an organic resin film, such as an acrylic resin film, formed by, for example, a known coating method. Then, the third layer L3 is formed by CVD. Through the above process, the TFT substrate 11 is formed. After that, the display device is manufactured through a known process. The process for removing the sealing film on the area to be the terminal on the TFT substrate 11 is described below.

Figure 6A:
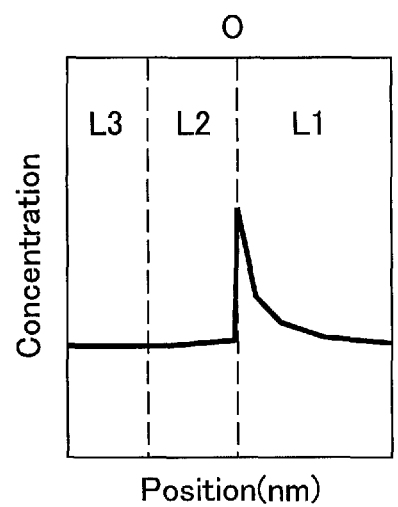
FIG. 6A is a diagram schematically showing a concentration change in a sealing film according to a first example of the embodiment of the present invention.
Figure 6B:
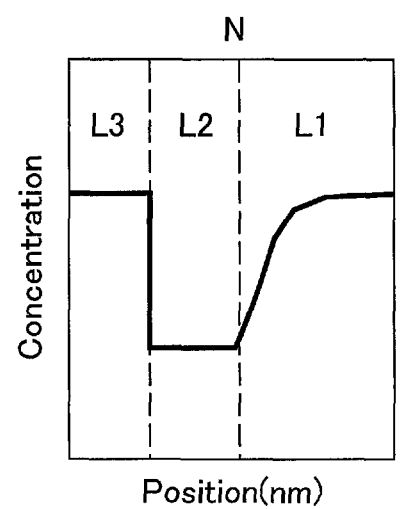
FIG. 6B is a diagram schematically showing a concentration change in the sealing film according to the first example of the embodiment of the present invention.
Figure 6C:
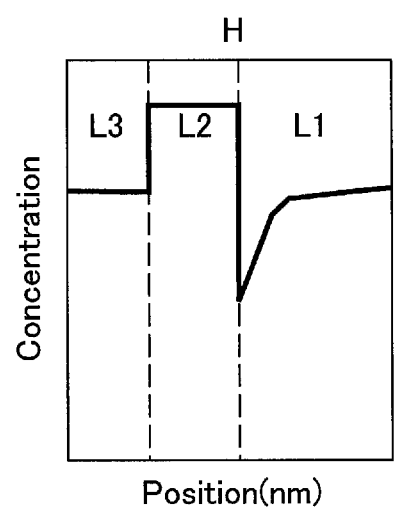
FIG. 6C is a diagram schematically showing a concentration change in the sealing film according to the first example of the embodiment of the present invention.

FIGS. 6A to 6C are each a diagram schematically showing a concentration change in the sealing film 33 according to the first example of this embodiment. In the diagrams, the horizontal axis represents the position (height) along the stacking direction in nanometers (nm). The diagrams show the position (height) along the stacking direction, in which the right side is the TFT substrate side and the left side is the CF substrate side. In the diagrams, the vertical axis represents the concentration of the corresponding component on a logarithmic scale in an arbitrary unit. FIG. 6A shows the concentration of O, FIG. 6B shows the concentration of N, and FIG. 6C shows the concentration of H. The concentration of the corresponding component shown in the diagrams can be measured, for example, by secondary ion mass spectrometry (SIMS) or by scanning electron microscope with energy-dispersive X-ray spectrometry (SEM-EDX) in cross section. For example, SIMS can measure how the corresponding component in the first layer L1 seamlessly changes in concentration. SIMS can select an analysis direction in view of an influence on profiles. Normally, analysis has only to be made in the direction opposite to the stacking direction (rightward in the diagrams: downward in the TFT substrate), that is, from the front side. However, analysis may be carried out in the stacking direction, that is, from the back side, or in both directions, depending on the purpose of the analysis. The analysis from the back side is called as, for example, SSDP-SIMS or backside SIMS. However, the normal SIMS (from the front side) is suitable for analysis of the sealing film 33 according to this embodiment.

In the sealing film 33 according to the first example of this embodiment, the change in the concentration of O shown in FIG. 6A is significant. In the first layer L1 formation process, the flow rate of N$_2$O gas is gradually increased in the stacking direction (upward). Accordingly, the concentration of O in the first layer L1 is rising seamlessly and monotonously leftward in FIG. 6A. Specifically, the concentration of O at the bottom of the first layer L1 is low (substantially zero) and is rising seamlessly toward the top of the first layer L1 as the flow rate of N$_2$O gas increases. Then, the concentration of O drops discontinuously at the interface with the second layer L2 and is low (substantially zero) in the second layer L2. The actual analysis shows a sharp change (steep slope) with a finite width in the concentration of O at the interface between the first layer L1 and the second layer L2, but the change is clearly different from a seamless change (gentle slope) in the concentration of O in the first layer L1. The limit value (extrapolation value) that the concentration of O in the first layer L1 approaches as the corresponding position moves from the bottom to the top (the interface) is different from the limit value that the concentration of O in the second layer approaches as the corresponding position moves from the top to the bottom (the interface). The rate of change (differential coefficient) of the concentration of O has different values, which causes a shape change with a finite width in the concentration of O, at the upper and lower sides of the interface between the first layer L1 and the second layer L2, and is substantially uncountable (a singularity) at the interface.

In the first layer L1 formation process, the flow rates of SiH$_4$ gas, NH$_3$ gas, H$_2$ gas, and N$_2$ gas are gradually and seamlessly decreased. Consequently, the concentration of N in the first layer L1 is falling seamlessly and monotonously leftward in FIG. 6B, and the concentration of H is falling seamlessly and monotonously leftward in FIG. 6C. Near the top of the first layer L1, the flow rates of NH$_3$ gas and N$_2$ gas are substantially zero, and the flow rate of N$_2$O gas is low (1.3). Accordingly, the concentration of N is low near the top of the first layer L1. The concentration of N in the second layer L2 is also low and approximately equal to that in the first layer L1 at the interface between the first layer L1 and the second layer L2. That is, the limit value that the concentration of N in the first layer L1 approaches as the corresponding position moves from the bottom to the top (the interface) is close to or equal to the limit value that the concentration of N in the second layer approaches as the corresponding position moves from the top to the bottom (the interface). However, the rate of change (differential coefficient) of the concentration of N has different values at the upper and lower sides of the interface between the first layer L1 and the second layer L2, and is a substantial singularity at the interface.

Similarly, in the first layer L1, the flow rates of $NH_3$ gas and $H_2$ gas are substantially zero, and the flow rate of $SiH_4$ gas for forming SiO is low (0.09), near the top of the first layer L1. Accordingly, the concentration of H is very low near the top of the first layer L1. The concentration of H in the second layer L2 is much higher than the concentration of H near the top of the first layer L1, because an acrylic resin contains H. That is, the limit value that the concentration of H in the first layer L1 approaches as the corresponding position moves from the bottom to the top (the interface) is different from the limit value that the concentration of H in the second layer approaches as the corresponding position moves from the top to the bottom (the interface). The rate of change (differential coefficient) of the concentration of H has different values at the upper and lower sides of the interface between the first layer L1 and the second layer L2, and is substantially uncountable (a singularity) at the interface.

The process for forming and the second layer L2 is discontinuous. The process for forming the second layer L2 and the third layer L3 is also discontinuous. Thus, a switching step is included between the first layer L1 formation process and the second layer L2 formation process. The same applies to the second layer L2 formation process and the third layer L3 formation process. Consequently, the concentration of each component changes discontinuously at the interface between the first layer L1 and the second layer L2 and at the interface between the second layer L2 and the third layer L3, except in the case where the concentration is substantially zero at the interface and the case where the concentration is unexpectedly the same at the interface. The concentration of each component in the second layer L2, which is formed by a coating method, is kept approximately constant and shows no significant change. The concentration of each component in the third layer L3 is also kept approximately constant and shows no significant change, because the types and the flow rates of gases used in CVD in the third layer L3 formation process.

Compared to the first example according to this embodiment, concentration changes in the sealing film according to the first comparative example will also be considered. Instead of the first layer L1 according to the first example, the sealing film according to the first comparative example has a two-layer structure including a SiN layer and a SiO layer, which are sequentially stacked from the substrate. Thus, the concentration of O is very low (substantially zero) in the SiN layer and high in the SiO layer. The concentrations of N and H are high in the SiN layer and very low in the SiO layer. In each layer formation process, the types and the flow rates of gases used in CVS are kept constant. Consequently, the concentration of each component in the SiN layer and the SiO layer becomes approximately constant and is discontinuous at the interface between the SIN layer and the SiO layer. That is, the limit value that the concentration of each component in the SiN layer approaches as the corresponding position moves from the bottom to the top (the interface) is different from the limit value that the concentration of the component in the SiO layer approaches as the corresponding position moves from the top to the bottom (the interface). The rate of change (differential coefficient) of the concentration of each component is approximately zero at the upper and lower sides of the interface between the SiN layer and the SiO layer and is a substantial singularity at the interface.

Thus, it can be said that the concentrations of the components in the first SiN layer and the SiO layer in the first comparative example change discontinuously, whereas the concentrations of at least some of the components in the first layer L1 in the first example of this embodiment change seamlessly. The discontinuity here means that the limit value of the concentration of a component has different values at the upper and lower sides of the position (height) concerned, or that the rate of change of the concentration of the component has different values at the upper and lower sides of the position (height) concerned even when the limit value have the same value (or a substantially similar value). It can also be said that the position (height) at which the concentrations of at least some of the components change discontinuously has the interface between the upper and lower layers. That is, the SiN layer and the SiO layer in the first comparative example has the interface between them, whereas the first layer L1 according to this embodiment has no interface in it.

Figure 7A:
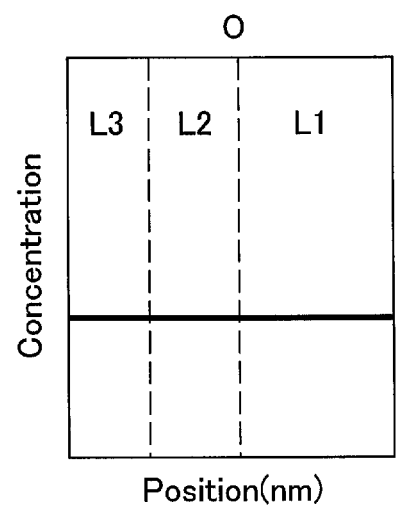
FIG. 7A is a diagram schematically showing a concentration change in a sealing film according to a second example of the embodiment of the present invention.
Figure 7B:
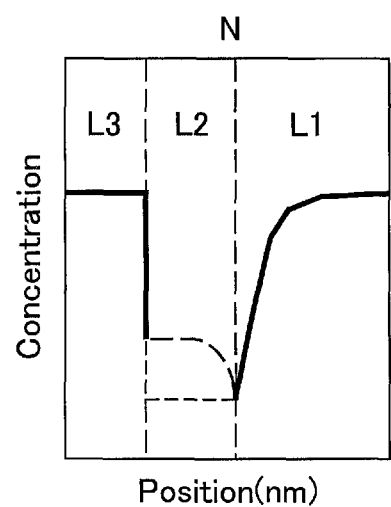
FIG. 7B is a diagram schematically showing a concentration change in the sealing film according to the second example of the embodiment of the present invention.
Figure 7C:
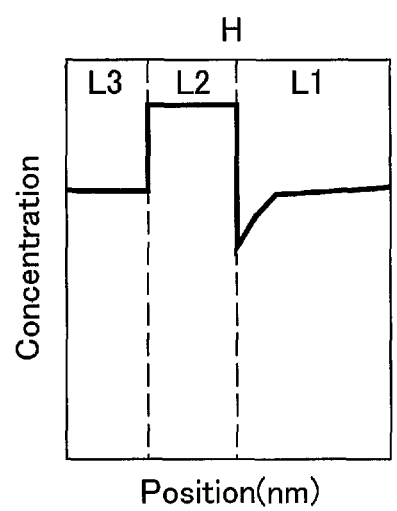
FIG. 7C is a diagram schematically showing a concentration change in the sealing film according to the second example of the embodiment of the present invention.
Figure 7D:
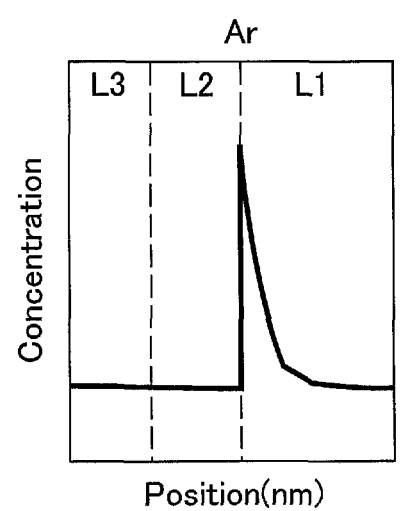
FIG. 7D is a diagram schematically showing a concentration change in the sealing film according to the second example of the embodiment of the present invention.

FIGS. 7A to 7D are each a diagram schematically showing a concentration change in the sealing film 33 according to the second example of this embodiment. The vertical and horizontal axes in the diagrams are the same as those in FIGS. 6A to 6C. FIG. 7A shows the concentration of O, FIG. 7B shows the concentration of N, FIG. 7C shows the concentration of H, and FIG. 7D shows the concentration of argon (Ar).

In the sealing film 33 according to the second example of this embodiment, no gas containing O is used, so that the concentration of O shown in FIG. 7A shows little change and is constant. However, the concentration of O can be affected by lining materials in the manufacturing equipment and the purity of gases used in CVD. In the sealing film 33 according to the second example, the change in the concentration of Ar shown in FIG. 7D is significant. In the first layer L1 formation process, the flow rate of Ar gas is gradually increased in the stacking direction. Accordingly, the concentration of Ar in the first layer L1 is rising seamlessly and monotonously. Then, the concentration of Ar drops discontinuously at the interface with the second layer L2 and is low (substantially zero) in the second layer L2 and the third layer L3.

In the first layer L1 formation process, like the first example, the flow rates of $SiH_4$ gas, $NH_3$ gas, $H_2$ gas, and $N_2$ gas are gradually and seamlessly decreased. Consequently, the concentrations of N and H in the first layer L1 are falling seamlessly and monotonously in the stacking direction. Unlike the first example, no $N_2O$ gas is used, so that the concentration of N at (and near) the top of the first layer L1 is lower than that in the first example. The flow rate (0.33) of $SiH_4$ gas for forming a-Si is higher than the flow rate of $SiH_4$ gas used in the first example, so that the concentration of H near the top of the first layer L1 is low but higher than that in the first example.

The concentration of each component in the second layer L2 and the third layer L3 is basically the same as that in the first example. In the first example, it is assumed that the concentration of N in the second layer L2, made of an acrylic resin, is equal to the concentration of N at the top of the first layer L1. Assuming that the concentration of N in the second layer L2 in the second example is equal to that in the first example, the concentration change of N in the second layer L2 is indicated by the upper dashed line in FIG. 7B. Assuming that the concentration of N in the second layer L2 in the second example is equal to the concentration of N at the top of the first layer L1 in the second example, the concentration change of N in the second layer L2 is indicated by the lower dashed line in FIG. 7B. Whereas these depend on the composition of the acrylic resin of the second layer L2, it can be said that, in any case, the concentration of N changes discontinuously at the interface between the first layer L1 and the second layer L2.

In this embodiment, the composition of the bottom of the first layer L1 is SiN, and the composition of the top of the first layer L1 is SiO (the first example) or a-Si (the second example). In this way, when the composition in the first layer L1 changes from a composition (composition A) to another composition (composition B), that is, between two types of compositions (compositions A and B) seamlessly in the stacking direction, each component monotonously increases or decreases, except for component(s) kept constant. The monotonous increase (monotonous decrease) here means, what is called, a monotonous increase (monotonous decrease) in a narrow sense, whose rate of change (differential coefficient) is positive (negative) and excludes a zero state. However, the composition change may begin at a middle position in the stacking direction or end at a middle position. Thus, it may be that the rate of change (differential coefficient) is zero from the bottom to where the change begins and from where the change ends to the top.

The thicknesses of the first layer L1 and the third layer L3 of the sealing film 33 according to this embodiment are each typically 400 nm. In the first layer L1 according to the first example, the composition changes from SiN to SiO seamlessly in the stacking direction. For convenience, the thickness of the portion to be SiO is defined using the concentration of O as below. The concentration of the bottom (right edge) and the concentration of the top (left edge) of the first layer L1 shown in FIG. 6A are averaged, and then the distance (thickness) from the position having the average value to the top is defined as the thickness of the portion to be SiO. The thickness of the portion to be SiO of the first layer L1 according to the first example is preferably 50 nm or less, typically, 10 nm. Also in the second example, for convenience, the thickness of the portion to be a-Si is defined using the concentration of N as below. The concentration of the bottom and the concentration of the top of the first layer L1 shown in FIG. 7B are averaged, and then the distance from the position having the average value to the top is defined as the thickness of the portion to be a-Si. The thickness of the portion to be a-Si of the first layer L1 according to the second example is preferably 50 nm or less, typically, 1 nm. The portion to be a-Si preferably has such a width as not to be colored.

A main feature of the present invention is that the sealing film 33 includes a mixed film. The sealing film 33 according to this embodiment has the three-layer structure including the first layer L1 at the bottom in the stacking direction. The first layer L1 formed on the top of the cathode is the mixed film. The sealing film may be formed of one mixed film or have a multilayer structure including one or more mixed films. For example, the sealing film may have a structure including a plurality of layer pairs, each of which is a pair of the first layer L1 and the second layer L2 (two layers), under the third layer L3. How to arrange the mixed film(s) may be selected depending on the purpose of forming the mixed film(s).

The bottom of the first layer L1 of the sealing film 33 according to this embodiment is formed of SiN. The bottom of the first layer L1 adjacent to the cathode is preferably formed of SiN, which has good resistance to moisture. The second layer L2 is formed of an acrylic resin for the purpose of providing protection from foreign matters (coverage) and improving sealing performance at a raised portion that is not fully sealed by the sealing film. In order to improve adhesion to the second layer L2 and thus prevent the second layer L2 from peeling off from the first layer L1, the top of the first layer L1 is preferably formed of SiO (the first example) or a-Si (the second example). The third layer L3 is formed of SiN, like the first layer L1, to be resistant to moisture. In practice, on a flat area in the top of the first layer L1 formed on the entire surface of the substrate, the second layer L2 is not formed or is formed very thin, except where a foreign matter exists. That is, the second layer L2 is formed in an island shape, resulting from its surface energy (wettability), on an even area on which a foreign matter exists and an uneven area with asperities. Accordingly, the thickness of the second layer L2 varies greatly depending on the area and thus the thickness distribution is large (typically, 0 to 800 nm), whereas the first layer L1 and the third layer L3 are formed relatively uniform in thickness (the thickness distribution is approximately uniform). However, if the amount of the material for forming the second layer L2 is increased, the material is formed into a film also on the area kept flat.

Figure 8A:
FIG. 8A is a cross-sectional view of the display device according to the embodiment of the present invention.
Figure 8B:
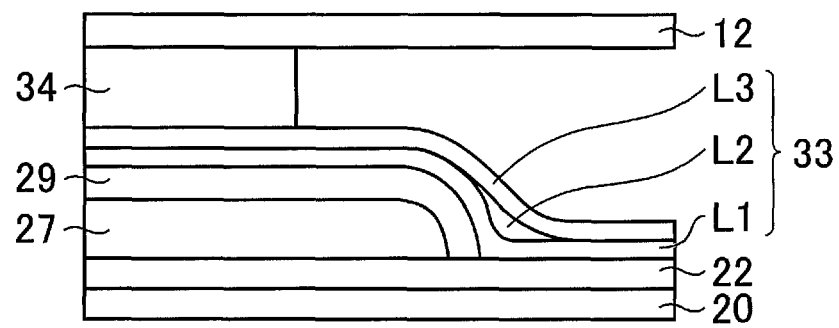
FIG. 8B is a cross-sectional view of the display device according to the embodiment of the present invention.

The following describes the sealing function of the sealing film 33 according to this embodiment. FIGS. 8A and 8B are each a cross-sectional view of the display device according to this embodiment. FIGS. 8A and 8B each show a cross section in the sealing area (the frame area) surrounding the display area DA. FIG. 8A shows a scanned cross section taken based on an SEM observation in cross section, and FIG. 8B schematically shows the cross section shown in FIG. 8A. As shown in FIG. 8B, the insulating film is formed on the glass substrate 20, and the planarization film 27 and the bank 29 are formed on the insulating film. The insulating film here is the gate insulating film 22, but is not limited to this. For example, the insulating film may be any of the gate insulating film 22, the insulating film 24, and the passivation film 26, or a combination of them. Then, the sealant 34 is provided on a flat area of the bank 29, and the TFT substrate 11 and the CF substrate 12 are bonded together to seal the display area DA. The planarization film 27 and the bank 29 extend beyond the peripheral edge of the display area DA, and the edges of them are positioned inside of the outer edge of the TFT substrate 11.

The first layer L1 of the sealing film 33 is formed on the entire surface of the substrate. However, the edge of the bank 29 rises steeply from the insulating film, and thus the first layer L1 fails to be stably formed at the place where the edge of the bank 29 meets the insulating film. However, the second layer L2 is formed, resulting from its surface energy, near where the edge of the bank 29 rises, as shown in FIGS. 8A and 8B. SiO or a-Si forming the top of the first layer L1 ensures adhesion between the first layer L1 and the second layer L2 and prevents the second layer L2 from peeling off from the first layer L1. In addition, the third layer L3 is formed on the entire surface of the substrate, thus improving the sealing function of the sealing film 33. The structure shown in FIGS. 8A and 8B is merely an example. The area (seal position) where the sealant 34 is provided, the edge position of the planarization film 27, and the edge position of the bank 29 can be modified through design.

Figure 9:
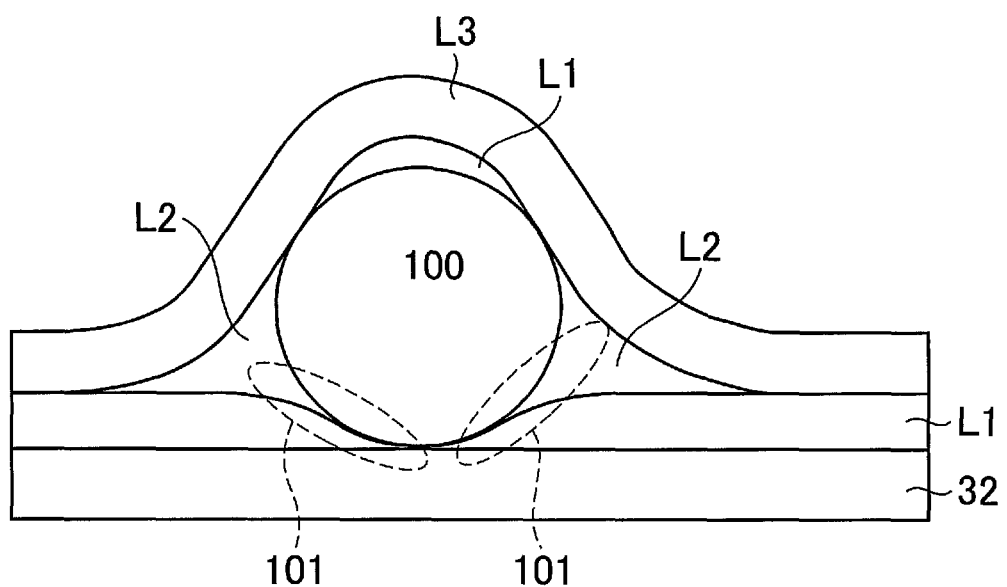
FIG. 9 is a cross-sectional view of the TFT substrate of the display device according to the embodiment of the present invention.

FIG. 9 is a cross-sectional view of the TFT substrate 11 of the display device according to this embodiment. FIG. 9 schematically shows part of a cross section of a point where the flat surface of the display area DA, including the pixel circuits, in the TFT substrate 11 has a foreign matter 100 on it. As described above, the first layer L1 of the sealing film 33 is formed on the entire surface of the cathode (the second cathode 32) on the substrate. However, when the cathode has the foreign matter 100 on it, the first layer L1 is partially formed on the foreign matter 100 but is hardly formed under the foreign matter 100. That is, such a point is where the first layer L1 is not stably formed on the cathode. However, the second layer L2 is formed, resulting from its surface energy, in the gap between the foreign matter 100 and the substrate (the first layer L1 and the cathode). SiO or a-Si forming the top of the first layer L1 ensures adhesion between the first layer L1 and the second layer L2. In addition, the third layer L3 is formed on the entire surface of the substrate, thus improving the sealing function of the sealing film 33. If the sealing film does not include the second layer L2 and has a two-layer structure including both SiN layers, the sealing film is not fully formed in the gap (a space 101 shown in FIG. 9) between the foreign matter 100 and the lower SiN layer to leave a gap (cavity). Thus, the sealing performance of the sealing film is not enough at such a point. To improve the sealing performance without the second layer L2, the sealing film made of SiN has to be formed thicker (e.g., 5 µm or more) than the sealing film 33 according to this embodiment. In contrast, the sealing film 33 according to this embodiment has the three-layer structure including the second layer L2 between the first layer L1 and the third layer L3. In addition, the top of the first layer L1 is SiO. Thus, the sealing film 33 provides enhanced protection from the foreign matter 100 and can prevent a gap (cavity) from being left in the space 101 shown in FIG. 9.

Figure 10:
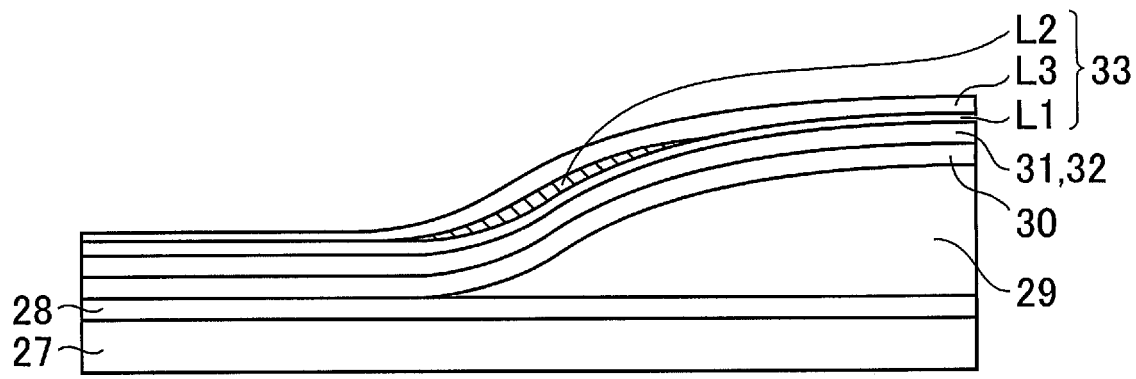
FIG. 10 is a cross-sectional view of the TFT substrate of the display device according to the embodiment of the present invention.

FIG. 10 is a cross-sectional view of the TFT substrate 11 of the display device according to this embodiment. FIG. 10 schematically shows part of a cross section of the portion surrounding a pixel circuit in the display area DA, including the pixel circuits, in the TFT substrate 11. As shown in FIG. 4, the anodes 28 are each formed in the predetermined shape on the planarization film 27 on the substrate, and the bank 29 is formed to insulate adjacent anodes 28 from each other. The cross section shown in FIG. 10 is in the portion where the bank 29 is formed to cover the edge of the anode 28. The edge of the bank 29 rises steeply from the anode 28, and the first layer L1 fails to be stably formed at the place where the edge of the bank 29 meets the anode 28. However, like the cross section shown in FIGS. 8A and 8B, the second layer L2 formed in such a place improves the sealing performance of the sealing film 33. If the sealing performance of the sealing film is not enough, moisture enters, for example, the organic EL layer 30 and may cause dead pixels and dark spots (DS) to occur on the display area DA. The sealing film 33 according to this embodiment, which has an improved sealing performance, can prevent such dead pixels and such dark spots from occurring.

Figure 11A:
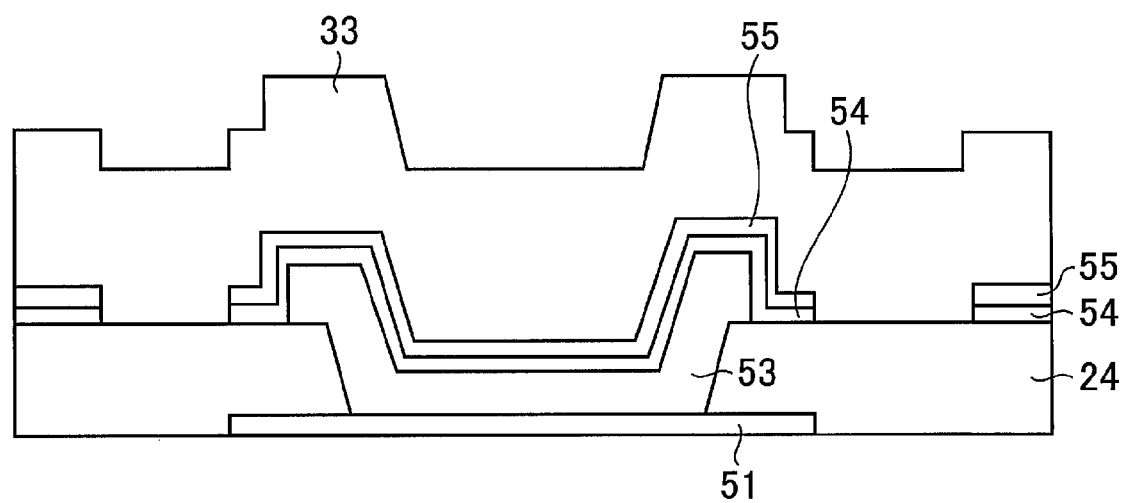
FIG. 11A is a cross-sectional view of the TFT substrate of the display device according to the embodiment of the present invention.
Figure 11B:
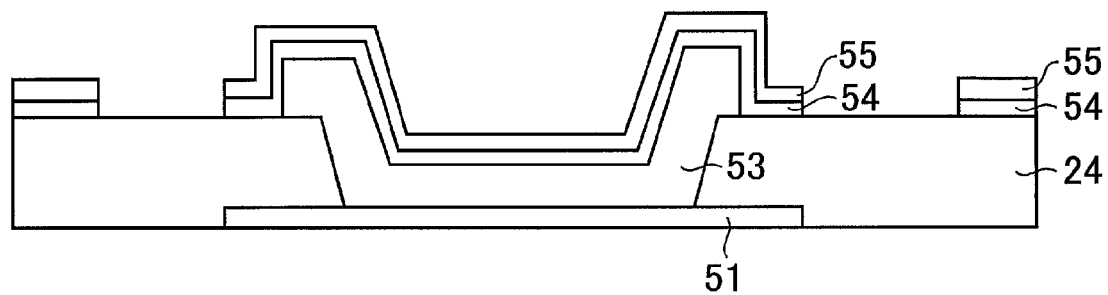
FIG. 11B is a cross-sectional view of the TFT substrate of the display device according to the embodiment of the present invention.

The following describes the structure of the terminal of the TFT substrate 11 according to this embodiment. FIGS. 11A and 11B are each a cross-sectional view of the TFT substrate 11 according to this embodiment and show one of the terminal electrodes disposed in the terminal. FIG. 11A shows part of a cross section of the TFT substrate 11 after forming the sealing film 33, and FIG. 11B shows part of a cross section of the TFT substrate 11 after removing the sealing film 33. On the edge of the TFT substrate 11, the terminal is disposed. In the above process for forming the pixel circuits, the terminal electrodes of the terminal are formed. The terminal electrode shown in FIGS. 11A and 11B includes four layers of electrode films (a first electrode film 51, a second electrode film 53, a third electrode film 54, and a fourth electrode film 55), but is not limited to this structure.

In the process for forming the gate electrode film 23 of the pixel circuit on the substrate (on the gate insulating film 22), the first electrode film 51 is formed of the same material as the gate electrode film 23. In the process for forming the metal layers 25 of the pixel circuit after forming the insulating film 24 and then forming the through holes, the second electrode film 53 is formed of the same material as the metal layers 25. In the process for forming the anodes 28 of the pixel circuit, the third electrode film 54 and the fourth electrode film 55 are formed. The anode 28 has the three-layer structure including the ITO film, the Ag film, and the ITO film. The third electrode film 54 is formed of the lower ITO film, and the fourth electrode film 55 is formed of the upper ITO film. The Ag film may or may not be formed between the third electrode film 54 and the fourth electrode film 55. Then, the sealing film 33 is also formed on the terminal of the TFT substrate 11 (FIG. 11A).

As shown in FIG. 2, a process, dry etching here, for removing the sealing film 33 on the terminal on the TFT substrate 11 is applied to the cells regularly arranged on the tray 2. The CF substrate 12 itself acts as a hard mask. Thus, without patterning using a resist or the like, the sealing film 33 on the terminal can be removed by dry etching. An etching gas used in such a process is a mixture of a fluorine-containing gas (e.g., $SF_6$, $CF_4$, or $NF_6$) and oxygen ($O_2$) gas. Additionally, argon (Ar) gas and nitrogen ($N_2$) gas may be further mixed. In particular, it is noteworthy that the selection ratio of SiN to ITO is very high. Thus, the removal of SiN causes little damage to the third electrode film 54 and the fourth electrode film 55, each formed of an ITO film. The reason is that ITO is easy to be etch using a chlorine-containing gas but is hardly etched using a fluorine-containing gas. Thus, in this embodiment, the sealing film 33 is preferably removed by dry etching. However, the process is not limited to this. For example, the sealing film 33 on the terminal may be removed by wet etching or laser irradiation.

In this embodiment, after both the TFT substrate 11 and the CF substrate 12 are cut into individual pieces by glass scribing, the sealing film on the terminal is removed. However, the process is, of course, not limited to this. The removing process may be performed on a large substrate, which is an array substrate including the TFT substrates 11, or a strip substrate, which is a substrate including the TFT substrates 11 aligned in a row. In any case, the sealing film 33 is formed on the entire surface of the TFT substrate 11, and then the sealing film on the terminal is removed. However, such arrangements can prevent adverse effects on the pixel circuits, such as organic EL layer 30, compared to the case of masking the area to be terminal and then partly forming the sealing film on the area including the display area DA. The reason is that partly forming the sealing film further requires a process for preparing a mask and a process for aligning the mask with the TFT substrate.

The display device according to the embodiment of the present invention is described above, but the display device according to the present invention is not limited to the above embodiment. In the above embodiment, the glass substrate 20 is used in the TFT substrate 11. Alternatively, a resin substrate, a metal substrate, or a flexible substrate may be used. In the above embodiment, the semiconductor film of the TFTs on the substrate is LTPS. Alternatively, the semiconductor film of the TFTs may be a-Si or an oxide semiconductor, or organic TFTs may be used. In the above embodiment, the counter substrate, which is bonded to the TFT substrate, includes the color filter. Alternatively, the TFT substrate may include a color filter. The present invention is most suitable for organic EL display devices, which can be easily and adversely affected by thermal environment in the manufacturing process, although, of course, the invention is not limited to this example. The present invention is widely applicable to display devices including pixel circuits and a sealing film on a substrate.

Various other variations and modifications can be conceived by those skilled in the art within the spirit of the present invention, and it will be understood that all such variations and modifications also fall within the scope of the invention. For example, those skilled in the art can appropriately modify the above embodiments by addition, deletion, or design change of components, or by addition, omission, or condition change of steps, and all such modifications also fall within the scope of the invention as long as they come within the spirit of the invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
pixel circuits on a substrate; and
a sealing film having a multilayer structure on the pixel circuits, the sealing film comprising a first layer being formed in contact with the pixel circuits and being made of a silicon-containing inorganic material, and a second layer being formed on at least part of a top of the first layer and being made of resin material,
wherein the first layer is a mixed film containing at least one component changing seamlessly in a stacking direction.

2. The display device according to claim 1,
wherein composition of the top of the first layer has higher adhesion to a bottom of the second layer than composition of a bottom of the first layer.

3. The display device according to claim 1, wherein the resin material of the second layer is an organic resin.

4. The display device according to claim 1,
wherein composition of a bottom of the first layer is one component selected from the group consisting of silicon nitride, silicon oxynitride, and silicon oxide.

5. The display device according to claim 1, wherein
composition of a bottom of the first layer is silicon nitride, and
composition of a top of the first layer is one component selected from the group consisting of silicon oxide and amorphous silicon.

6. The display device according to claim 1, wherein
the pixel circuits include an organic electroluminescence layer.

7. A manufacturing method of a display device, the method comprising:
forming pixel circuits on a substrate; and
forming a sealing film having a multilayer structure on the pixel circuits, the sealing film comprising a first layer being formed in contact with the pixel circuits and being made of a silicon-containing inorganic material,
wherein
the first layer is sequentially formed by changing at least one component of the first layer seamlessly in a stacking direction,
in a process for forming the first layer by chemical vapor deposition, types and flow rates of process gases flowing in are changed seamlessly,
the sealing film further includes a second layer made of a resin material, and
the second layer is formed on at least part of a top of the first layer.

* * * * *